United States Patent [19]

Anami

[11] Patent Number: 6,157,249
[45] Date of Patent: Dec. 5, 2000

[54] SEMICONDUCTOR INTEGRATED CIRCUIT WITH REDUCED DEVICE AND INTERCONNECTION AREAS

[75] Inventor: Hiroaki Anami, Kanagawa, Japan

[73] Assignee: NEC Corporation, Tokyo, Japan

[21] Appl. No.: 09/340,144

[22] Filed: Jun. 28, 1999

[30] Foreign Application Priority Data

Jun. 26, 1998 [JP] Japan ................................... 10-181057

[51] Int. Cl.$^7$ .................................................. H01L 25/00
[52] U.S. Cl. ........................................... 327/565; 257/379
[58] Field of Search .................................. 257/379, 380, 257/360, 355; 327/565

[56] References Cited

U.S. PATENT DOCUMENTS 5,767,552 6/1998 Casper et al. ........................... 257/379
6,064,093 5/2000 Ohta ........................................ 257/355

*Primary Examiner*—Tuan T. Lam
*Assistant Examiner*—Linh Nguyen
*Attorney, Agent, or Firm*—Young & Thompson

[57] ABSTRACT

The present invention provides a layout of contacts over a diffusion region of a semiconductor device. The layout comprises: a first contact set of at least a plurality of first type contacts being positioned in a first sub-ordinate region and being electrically connected to a voltage supply line supplying the first contact set with a first voltage level and a second contact set of at least a plurality of second type contacts being positioned in a second sub-ordinate region which is separated from the first sub-ordinate region by an intermediate sub-ordinate region which acts to provide a first resistance between the first contact set and the second contact set, so that the second contact set receives a second voltage level different from the first voltage level

28 Claims, 10 Drawing Sheets

ESD standard          ESD standard          ESD standard

SEMICONDUCTOR INTEGRATED CIRCUIT WITH REDUCED DEVICE AND INTERCONNECTION AREAS

BACKGROUND OF THE INVENTION

The present invention relates to a semiconductor integrated circuit, and more particularly to a semiconductor integrated circuit suitable for realizing an increased high degree of integration thereof and also for reducing areas of devices and interconnections thereof.

The semiconductor integrated circuit has p-channel and n-channel MOS field effect transistors acting as switching devices. In order to control the switching operations of the MOS field effect transistor, it is required to apply the gate control signal to the gate electrode of the MOS field effect transistors. A ground level gate control signal is applied to the gate electrode of the p-channel MOS field effect transistor. A power voltage level gate control signal is applied to the gate electrode of the n-channel MOS field effect transistor. It is also necessary to render the gate electrode have a surge resistance against electrostatic or to prevent the device from being broken due to electrostatic discharge, for which purposes the gate signal is required to be applied to the gate electrode through a certain resistance of, for example, a few kΩ.

Such the above n-channel and p-channel MOS field effect transistors having the resistances against the gate electrostatic discharge have normally been designed in accordance with the normal layout standard, wherein a distance between adjacent two of source pads is set at a predetermined value.

Further, other n-channel and p-channel MOS field effect transistors having the resistances against the source electrostatic discharge have been known, wherein a ground level signal is applied to the source electrode of the p-channel MOS field effect transistor or a power voltage level is applied to the source electrode of the n-channel MOS field effect transistor. The design standards are specific layout standard or electrostatic discharge standard, wherein a distance of the adjacent two of the source pads is larger than in the above normal layout standard.

FIG. 1 is a circuit diagram illustrative of a first conventional semiconductor integrated circuit. The first conventional semiconductor integrated circuit comprises first and second p-channel MOS field effect transistors P1 and P2 and four n-channel MOS field effect transistors N1, N2, N3 and N4 as well as a first invertor INV. A first series connection of the first p-channel MOS field effect transistor P1, the first n-channel MOS field effect transistor N1 and the third n-channel MOS field effect transistor N3 is formed between a high voltage line and a ground line. A second series connection of the second p-channel MOS field effect transistor P2, the second n-channel MOS field effect transistor N2 and the fourth n-channel MOS field effect transistor N4 is also formed between the high voltage line and the ground line.

The first p-channel MOS field effect transistor P1 is connected in series between the high voltage line and the first n-channel MOS field effect transistor N1. A gate of the first p-channel MOS field effect transistor P1 is also connected to a second node 2 between the second p-channel MOS field effect transistor P2 and the second n-channel MOS field effect transistor N2. The first n-channel MOS field effect transistor N1 is connected in series between the first p-channel MOS field effect transistor P1 and the third n-channel MOS field effect transistor N3. A gate of the first n-channel MOS field effect transistor N1 is applied with a high power voltage VCC The third n-channel MOS field effect transistor N3 is connected in series between the first n-channel MOS field effect transistor N1 and the ground line. A gate of the third n-channel MOS field effect transistor N3 receives a gate control signal of high level "H" or low level "L". The gate of the third n-channel MOS field effect transistor N3 is also connected to an input side of the first invertor INV.

The second p-channel MOS field effect transistor P2 is connected in series between the high voltage line and the second n-channel MOS field effect transistor N2. A gate of the second p-channel MOS field effect transistor P2 is also connected to a first node 1 between the first p-channel MOS field effect transistor P1 and the first n-channel MOS field effect transistor N1 The second n-channel MOS field effect transistor N2 is connected in series between the second p-channel MOS field effect transistor P2 and the fourth n-channel MOS field effect transistor N4. A gate of the second n-channel MOS field effect transistor N2 is connected to the gate of the first n-channel MOS field effect transistor N1 and thus is applied with the high power voltage VCC. The fourth n-channel MOS field effect transistor N4 is connected in series between the second n-channel MOS field effect transistor N2 and the ground line. A gate of the fourth n-channel MOS field effect transistor N4 is connected to an output side of the first invertor INV for receiving an output signal from the first invertor into which the gate control signal of high level "H" or low level "L" is inputted, so that the gate of the fourth n-channel MOS field effect transistor N4 receives the inverted signal to the gate control signal which is applied to the gate of the third n-channel MOS field effect transistor N3.

The above circuit acts as a level shifter. The gate levels of the first and second n-channel MOS field effect transistors N1 and N2 are fixed at the high power voltage level VCC, so as to reduce the voltage level to be applied to the third and fourth n-channel MOS field effect transistors N3 and N4 by a threshold voltage of the n-channel MOS field effect transistor for relaxation of the stress.

The gate electrostatic discharge resistant type p-channel and n-channel MOS field effect transistors are applicable for various purposes such as for obtaining a pull-up voltage from the high power voltage VCC or obtaining a pull-down voltage from the ground level.

A method of laying out resistances on semiconductor integrated circuits having gate electrostatic discharge resistant type MOS field effect transistors will subsequently be described.

FIG. 2 is a diagram illustrative of a conventional layout of the resistances in a part of the semiconductor integrated circuit in FIG. 1. A first MOS field effect transistor 2a and a second MOS field effect transistor 3 are shown in FIG. 2. The first MOS field effect transistor 2a shown in FIG. 2 may correspond to the first p-channel MOS field effect transistor P1 shown in FIG. 1. The second MOS field effect transistor 3 shown in FIG. 2 may correspond to the first n-channel MOS field effect transistor N1 shown in FIG. 1. The gate of the second MOS field effect transistor 3 corresponding to the first n-channel MOS field effect transistor N1 is also connected through an interconnection 4a to the source of the first MOS field effect transistor 2a corresponding to the first p-channel MOS field effect transistor P1. A resistance 5 of a few k-ohms is also formed between the source contacts "S" of the first MOS field effect transistor 2a, so that the resistance 5 is connected between the high power voltage line and the source electrode of the first MOS field effect transistor 2a. The resistance 5 may be formed by partially removing the source contacts and utilizing diffusion layers of the first MOS field effect transistor 2a.

When the resistive diffusion regions are individually provided, the resistance region of a few k-ohms are required to be designed in the electrostatic discharge standard, so that each of the resistive diffusion regions is larger in occupied area than what is designed in the normal standard whereby the total area of the semiconductor integrated circuit is also increased.

Alternative method of forming the resistance having already been known in the art will be described FIG. 3 is a diagram illustrative of another conventional layout of the resistances in a part of the semiconductor integrated circuit in FIG. 1. A power supply resistive region 1a' is separately provided which acts as a resistance only but not performs as transistor, so that a resistance 5 of a few k-ohms is formed in the power supply resistive region 1a'. The power supply resistive region 1a' has a guard ring 6 in circumferential portions of the power supply resistive region 1a' for preventing latch-up phenomenon. The peripheral portions of the electrostatic discharge standard region and the n-channel and p-channel MOS field effect transistors are also surrounded by the guard rings. A resistive diffusion region 5 is formed in the resistive region 1a and surrounded by the guard ring 6, wherein the resistive diffusion region 5 extends from the power contact 11 to another contact 12. The other contact 12 is to be connected to the gate of the transistor The resistive diffusion region 5 acts as a resistance between the power contact 11 and the other contact 12. The resistive diffusion region 5 is partially expanded but only around the power contact 11, so that the resistive diffusion region 5 increases in width around the power contact 11 to surround the power contact, whilst the remaining part of the resistive diffusion region 5 has a standard width which is much narrower than the expanded portion thereof around the power contact 11. Consequently, it is necessary that the resistive diffusion region 5 is designed in the electrostatic discharge standard wherein the distance is more wide than the normal standard for allowing the formation of the expanding portion of the resistive diffusion region 5.

When the resistive diffusion regions are individually provided, the resistance region of a few k-ohms are required to be designed in the electrostatic discharge standard, so that each of the resistive diffusion regions is larger in occupied area than what is designed in the normal standard, whereby the total area of the semiconductor integrated circuit is also increased.

FIG. 4 is a diagram illustrative of the conventional layout of the semiconductor integrated circuit using the transistor region of FIG. 2 or the resistance region of FIG 3. A single power source transistor region 1a is formed commonly to a plurality of the transistors 3, for example, four transistors 3, wherein the gate contact of each of the four transistors 3 is connected through the interconnection 4a to the single power source transistor region la, so that the four transistors 3 are connected to the single power source transistor region 3 in parallel to each other. In such layout, the increase in the number of the transistors 3 connected to the single power source transistor region 1a in parallel to each other results in the increase in the length of the interconnection 4a which connects the transistors 3 to the single power source transistor region 1a.

When the single resistive diffusion region is provided commonly to a plurality of the transistors, the interconnections are provided for connecting the individual transistors to the single and common resistive diffusion region, whereby the individual interconnections are increased in length and thus the total occupied area of the plural interconnections is also increased. As a result, the total area of the semiconductor integrated circuit is also increased.

The following descriptions will focus on the conventional layout of the source electrostatic discharge resistant n-channel and p-channel MOS field effect transistors. The power voltage level is applied to the source of the source electrostatic discharge resistant type n-channel MOS field effect transistor. The ground level is also applied to the source of the source electrostatic discharge resistant p-channel MOS field effect transistor.

FIG. 5A is a diagram illustrative of the conventional source electrostatic discharge resistant type n-channel MOS field effect transistor. FIG. 5B is a diagram illustrative of the conventional layout of a plurality of the conventional source electrostatic discharge resistant type n-channel MOS field effect transistor shown in FIG. 5A. As illustrated in FIG. 5A, the conventional source electrostatic discharge resistant type n-channel MOS field effect transistor 7 is designed in a larger electrostatic discharge standard than the normal layout standard. Namely, the design is so made as to keep sufficient distances "t1", "t2" and "t3" of the source contact "S" from four edges of the source diffusion region in order to increase the resistance for stress relaxation, thereby suppressing concentration of charges at the source contact "S" for preventing p-n junction from being broken. Drain contacts "D" are formed in a drain diffusion region separated from the source diffusion region by a channel region over which a gate electrode "G" is formed. Namely, the distances "t1" and "t2" between the source contact "S" and the edges of the source diffusion region and also the distance "t3" between the source contact "S" and the gate electrode "G" are wider than what is designed in the normal standard.

When the semiconductor integrated circuit is designed with use of such the conventional source electrostatic discharge resistant type MOS field effect transistor as shown in FIG. 5A, then it is necessary to apply the above electrostatic standard to all of the transistors, whereby a total area of the semiconductor integrated circuit is remarkably increased. Namely, as illustrated in FIG. 5B, each of the conventional source electrostatic discharge resistant type MOS field effect transistors 7 is deigned in the above electrostatic standard so that the each of the conventional source electrostatic discharge resistant type MOS field effect transistors 7 is larger in occupied area than the normal layout standard, for which reason the total occupied area of the semiconductor integrated circuit is made much larger than that designed in the normal standard.

In the above circumstances, it had been required to develop a novel semiconductor integrated circuit suitable for realizing an increased high degree of integration thereof and also for reducing areas of devices and interconnections thereof.

SUMMARY OF THE INVENTION

Accordingly, it is an object of the present invention to provide a novel semiconductor integrated circuit free from the above problems.

It is a further object of the present invention to provide a novel semiconductor integrated circuit suitable for realizing an increased high degree of integration thereof and also for reducing areas of devices and interconnections thereof.

It is a still further object of the present invention to provide a novel layout of devices and interconnections to be integrated for realizing an increased high degree of integration thereof and also for reducing areas of devices and interconnections thereof.

The first present invention provides a layout of contacts over a diffusion region of a semiconductor device. The layout comprises: a first contact set of at least a plurality of first type contacts being positioned in a first sub-ordinate region and being electrically connected to a voltage supply line supplying the first contact set with a first voltage level; and a second contact set of at least a plurality of second type contacts being positioned in a second sub-ordinate region which is separated from the first sub-ordinate region by an intermediate sub-ordinate region which acts to provide a first resistance between the first contact set and the second contact set, so that the second contact set receives a second voltage level different from the first voltage level.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
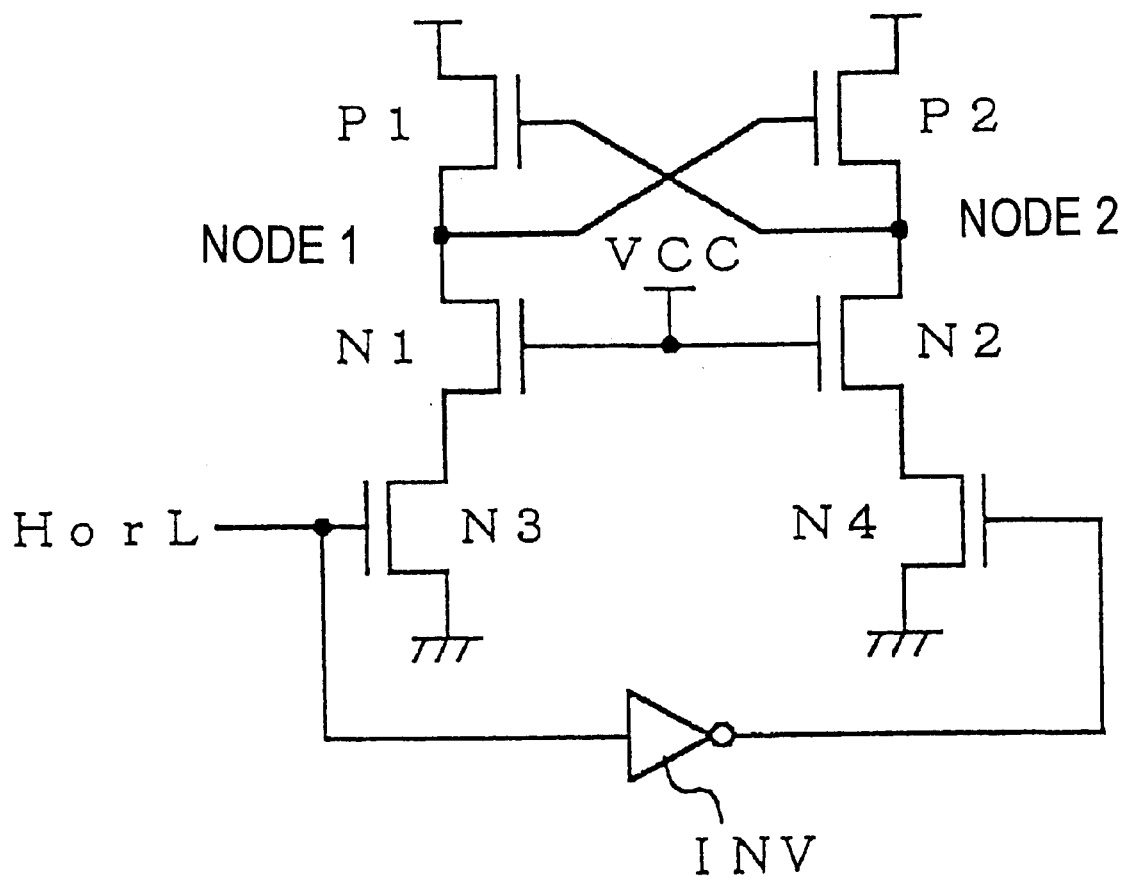
FIG. 1 is a circuit diagram illustrative of a first conventional semiconductor integrated circuit.
Figure 2:
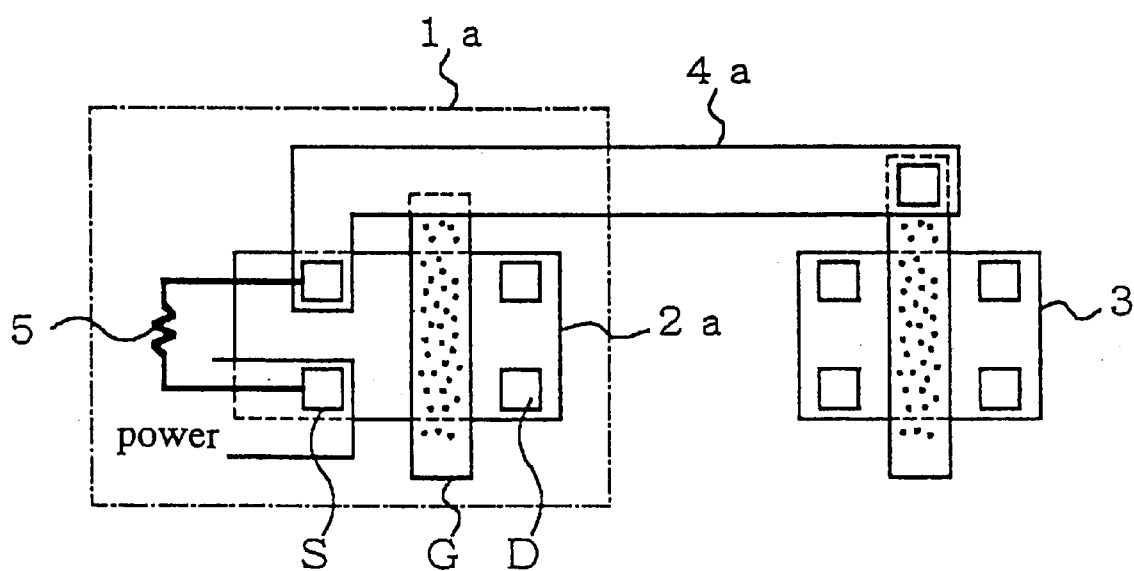
FIG. 2 is a diagram illustrative of a conventional layout of the resistances in a part of the semiconductor integrated circuit in FIG. 1.

The first present invention provides a layout of contacts over a diffusion region of a semiconductor device. The layout comprises: a first contact set of at least a plurality of first type contacts being positioned in a first sub-ordinate region and being electrically connected to a voltage supply line supplying the first contact set with a first voltage level; and a second contact set of at least a plurality of second type contacts being positioned in a second sub-ordinate region which is separated from the first sub-ordinate region by an intermediate sub-ordinate region which acts to provide a first resistance between the first contact set and the second contact set, so that the second contact set receives a second voltage level different from the first voltage level.

It is preferable that the intermediate sub-ordinate region comprises an intermediate part of the diffusion region, which acts to provide the first resistance.

It is more preferable that the semiconductor device is a field effect transistor having a gate electrode and the diffusion region is a source region, and the second sub-ordinate region is positioned closer to the gate electrode than the first sub-ordinate region, and the intermediate sub-ordinate region is an intermediate part of the source region, which acts to provide the first resistance.

It is further more preferable that the first contact set comprises a plurality of the first type contacts aligned along an opposite side to an adjacent side to a channel region over which the gate electrode extends, and the second contact set comprises a plurality of the second type contacts aligned along the adjacent side The second present invention provides a layout of at least a first type semiconductor device, at least a second type semiconductor device being smaller in occupied area than the first type semiconductor device, and at least an interconnection extending at least between the first type semiconductor device and the second type semiconductor device, wherein the first type semiconductor device has the above layout of the first present invention, and the interconnection is connected with the second contact set, so that the second voltage level is applied through the interconnection to the second type semiconductor device.

It is preferable that the intermediate sub-ordinate region comprises an intermediate part of the diffusion region, which acts to provide the first resistance It is more preferable that the first type and second type semiconductor devices are field effect transistors having gate electrodes, and the diffusion region of the first type semiconductor device is a source region, and the second sub-ordinate region is positioned closer to the gate electrode than the first sub-ordinate region, and the intermediate sub-ordinate region is an intermediate part of the source region, which acts to provide the first resistance.

It is further more preferable that the first contact set comprises a plurality of the first type contacts aligned along an opposite side to an adjacent side to a channel region over which the gate electrode extends, and the second contact set comprises a plurality of the second type contacts aligned along the adjacent side.

It is also preferable that the interconnection extends between the second contact set of the first type semiconductor device and the gate electrode of the second type semiconductor device, so that the second voltage level is applied through the interconnection to the gate of the second type semiconductor device.

It is more preferable that plural pairs of the first type semiconductor device and the second type semiconductor device are separately integrated from each other.

It is also preferable that the interconnection extends between the second contact set of the first type semiconductor device and at least a source contact of the second type semiconductor device, so that the second voltage level is applied through the interconnection to the source contact of the second type semiconductor device.

It is more preferable that a plurality of the second type semiconductor devices are commonly connected through the interconnection to the second contact set of the first type semiconductor device.

It is also preferable that the interconnection extends among the second contact set of the first type semiconductor device, the gate electrode of at least one of the second type semiconductor devices, and a source contact set of at least another of the second type semiconductor devices, so that the second voltage level is applied through the interconnection to both the gate electrode of the at least one of the second type semiconductor devices and also the source contact set of the at least another of the second type semiconductor devices.

It is more preferable that the interconnection extends among the second contact set of the first type semiconductor device, the gate electrodes of a first plurality of the second type semiconductor devices, and the source contact sets of a second plurality of the second type semiconductor devices, so that the second voltage level is applied through the interconnection to both the gate electrodes of the first plurality of the second type semiconductor devices and also the source contact set of the second plurality of the second type semiconductor devices.

The third present invention provides a contact structure over a diffusion region of a semiconductor device. The contact structure comprises a first contact set of at least a plurality of first type contacts being positioned in a first sub-ordinate region and being electrically connected to a voltage supply line supplying the first contact set with a first voltage level; and a second contact set of at least a plurality of second type contacts being positioned in a second sub-ordinate region which is separated from the first sub-ordinate region by an intermediate sub-ordinate region which acts to provide a first resistance between the first contact set and the second contact set, so that the second contact set receives a second voltage level different from the first voltage level.

It is preferable that the intermediate sub-ordinate region comprises an intermediate part of the diffusion region, which acts to provide the first resistance.

It is more preferable that the semiconductor device is a field effect transistor having a gate electrode and the diffusion region is a source region, and the second sub-ordinate region is positioned closer to the gate electrode than the first sub-ordinate region, and the intermediate sub-ordinate region is an intermediate part of the source region, which acts to provide the first resistance It is further more preferable that the first contact set comprises a plurality of the first type contacts aligned along an opposite side to an adjacent side to a channel region over which the gate electrode extends, and the second contact set comprises a plurality of the second type contacts aligned along the adjacent side.

The fourth present invention provides a semiconductor integrated circuit of at least a first type semiconductor device, at least a second type semiconductor device being smaller in occupied area than the first type semiconductor device, and at least an interconnection extending at least between the first type semiconductor device and the second type semiconductor device, wherein the first type semiconductor device has a contact structure as claimed in claim 15, and the interconnection is connected with the second contact set, so that the second voltage level is applied through the interconnection to the second type semiconductor device.

It is preferable that the intermediate sub-ordinate region comprises an intermediate part of the diffusion region, which acts to provide the first resistance.

It is more preferable that the first type and second type semiconductor devices are field effect transistors having gate electrodes, and the diffusion region of the first type semiconductor device is a source region, and the second sub-ordinate region is positioned closer to the gate electrode than the first sub-ordinate region, and the intermediate sub-ordinate region is an intermediate part of the source region, which acts to provide the first resistance.

It is further more preferable that the first contact set comprises a plurality of the first type contacts aligned along an opposite side to an adjacent side to a channel region over which the gate electrode extends, and the second contact set comprises a plurality of the second type contacts aligned along the adjacent side.

It is also preferable that the interconnection extends between the second contact set of the first type semiconductor device and the gate electrode of the second type semiconductor device, so that the second voltage level is applied through the interconnection to the gate of the second type semiconductor device.

It is more preferable that plural pairs of the first type semiconductor device and the second type semiconductor device are separately integrated from each other.

It is also preferable that the interconnection extends between the second contact set of the first type semiconductor device and at least a source contact of the second type semiconductor device, so that the second voltage level is applied through the interconnection to the source contact of the second type semiconductor device.

It is more preferable that a plurality of the second type semiconductor devices are commonly connected through the interconnection to the second contact set of the first type semiconductor device.

It is also preferable that the interconnection extends among the second contact set of the first type semiconductor device, the gate electrode of at least one of the second type semiconductor devices, and a source contact set of at least another of the second type semiconductor devices, so that the second voltage level is applied through the interconnection to both the gate electrode of the at least one of the second type semiconductor devices and also the source contact set of the at least another of the second type semiconductor devices.

It is more preferable that the interconnection extends among the second contact set of the first type semiconductor device, the gate electrodes of a first plurality of the second type semiconductor devices, and the source contact sets of a second plurality of the second type semiconductor devices, so that the second voltage level is applied through the interconnection to both the gate electrodes of the first plurality of the second type semiconductor devices and also the source contact set of the second plurality of the second type semiconductor devices.

The foregoing mentioned first type semiconductor device may correspond to the semiconductor device designed in the electrostatic discharge standard The foregoing mentioned second type semiconductor device may correspond to the semiconductor device designed in the normal standard.

PREFERRED EMBODIMENTS

First Embodiment

Figure 6:
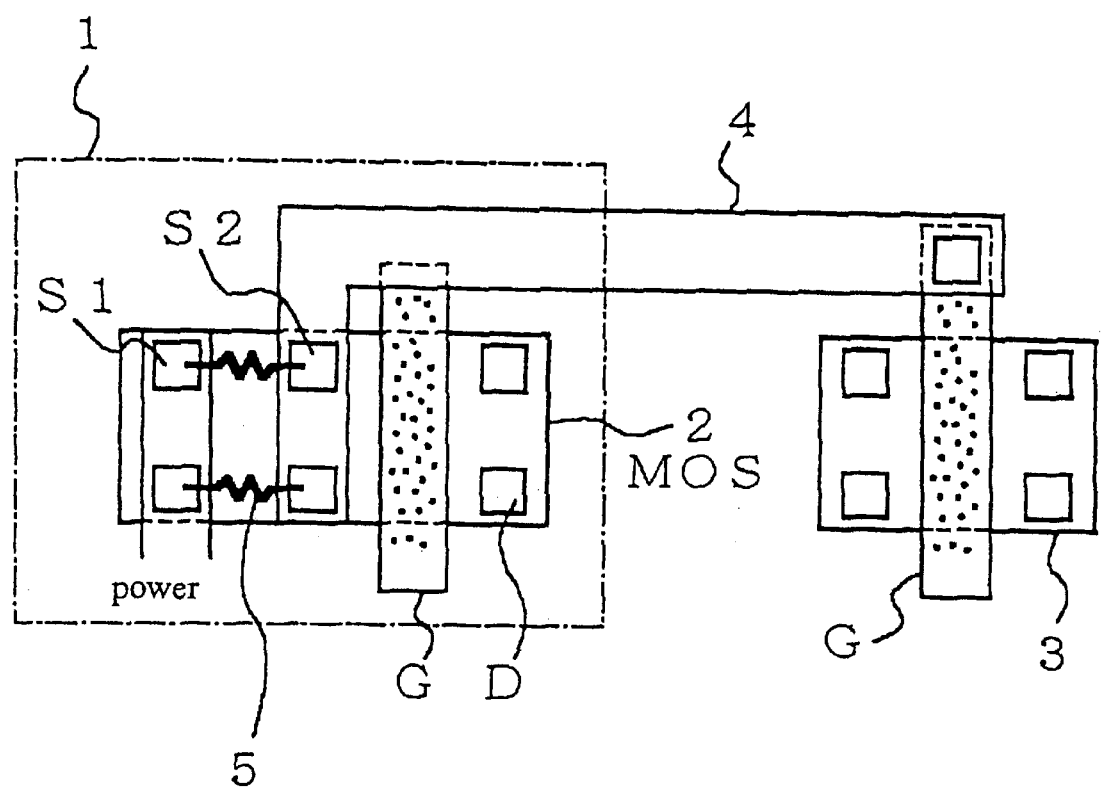
FIG. 6 is a diagram illustrative of a novel layout of a semiconductor integrated circuit having a first type MOS field effect transistor designed in an electrostatic discharge standard and a second type MOS field effect transistor designed in a normal discharge standard connected through an interconnection to said first type MOS field effect transistor in a first embodiment according to the present invention.

A first embodiment according to the present invention will be described in detail with reference to the drawings. FIG. 6 is a diagram illustrative of a novel layout of a semiconductor integrated circuit having a first type MOS field effect transistor designed in an electrostatic discharge standard and a second type MOS field effect transistor designed in a normal discharge standard connected through an interconnection to said first type MOS field effect transistor in a first embodiment according to the present invention.

A first type MOS field effect transistor 2 is designed in an electrostatic discharge standard and is provided in a power supply transistor region 1. The first type MOS field effect transistor 2 has source and drain diffusion regions and a gate electrode "G". Two drain contacts "D" are provided in the drain region and also aligned along a channel width direction of the first type MOS field effect transistor 2. A first set of first type source contacts S1 and a second set of second type source contacts S2 are provided in the source region. The first type source contacts S1 are positioned in a first sub-ordinate region of the source region, wherein the first sub-ordinate region is close to an opposite side to an adjacent side to a channel region over which the gate electrode "G" is formed. The first type source contacts S1 are aligned along the opposite side. The first type source contacts S1 are electrically connected to a power supply line which supplies a power voltage which is higher than a ground level. The second type source contacts S2 are positioned in a second sub-ordinate region of the source region, wherein the second sub-ordinate legion is closer to the adjacent side to the channel region The second sub-ordinate region is separated from the first sub-ordinate region by an intermediate sub-ordinate region which acts to provide a diffusion resistance 5 between the fist type and second type source contacts S1 and S2. The second type source contacts S2 are aligned along the adjacent side. The second type source contacts S2 are electrically connected through the diffusion resistance 5 provided by the intermediate sub-ordinate region to the first type source contacts S1, whereby the second type source contacts S2 receive a lower voltage level than the power voltage level of the first type source contacts S1 by a voltage drop due to the diffusion resistance 5.

A second type MOS field effect transistor 3 is designed in a normal standard and is provided in a region separated from the above power supply transistor region 1. The second type MOS field effect transistor 3 has source and drain diffusion regions and a gate electrode "G". Two drain contacts are provided in the drain region and also aligned along a channel width direction of the first type MOS field effect transistor 2. Two source contacts are provided in the source region and also aligned along the channel width direction.

An interconnection 4 extends between the second set of the second type source contacts "S2" and the gate "G" of the second type MOS field effect transistor 3, so that the lower voltage level dropped by the diffusion resistance 5 from the power voltage level is also applied through the interconnection 4 to the gate electrode "G" of the second type MOS field effect transistor 3.

The above novel source contact layout provides a plurality of the first type source contacts and a plurality of second type source contacts so as to prevent concentration of charges and also prevents the contacts from being broken.

Figure 5A:
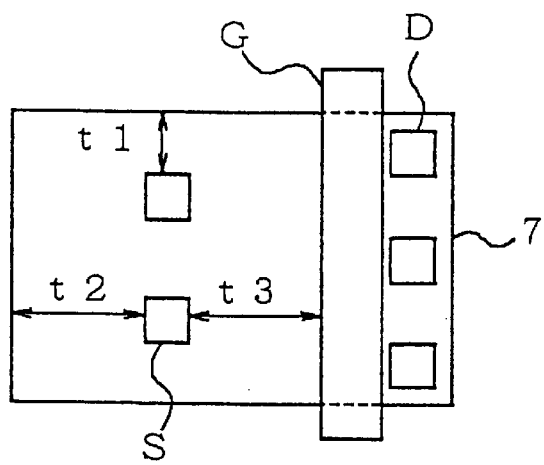
FIG. 5A is a diagram illustrative of the conventional source electrostatic discharge resistant type n-channel MOS field effect transistor.
Figure 5B:
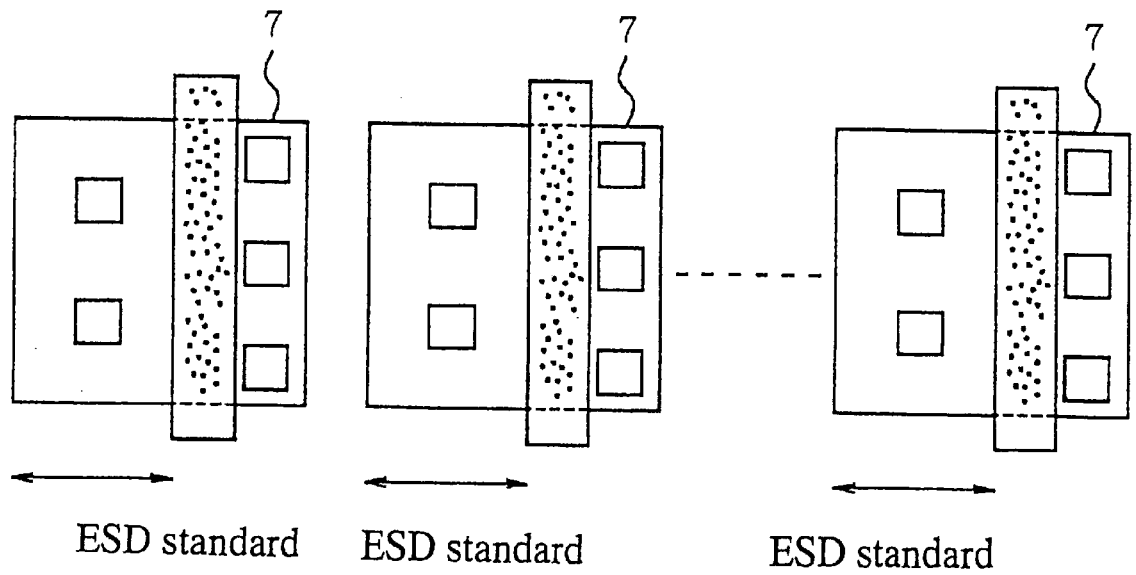
FIG. 5B is a diagram illustrative of the conventional layout of a plurality of the conventional source electrostatic discharge resistant type n-channel MOS field effect transistor shown in FIG. 5A.

The above novel source contact layout providing a plurality of the first type source contacts and a plurality of second type source contacts, however, effectively utilizes an increased area of the source region of the transistor designed in the electrostatic discharge standard which requires the enlargement of the source regions as described with reference to FIG. 5A, without any unnecessary increase in the total area of the integrated circuit.

Figure 7:
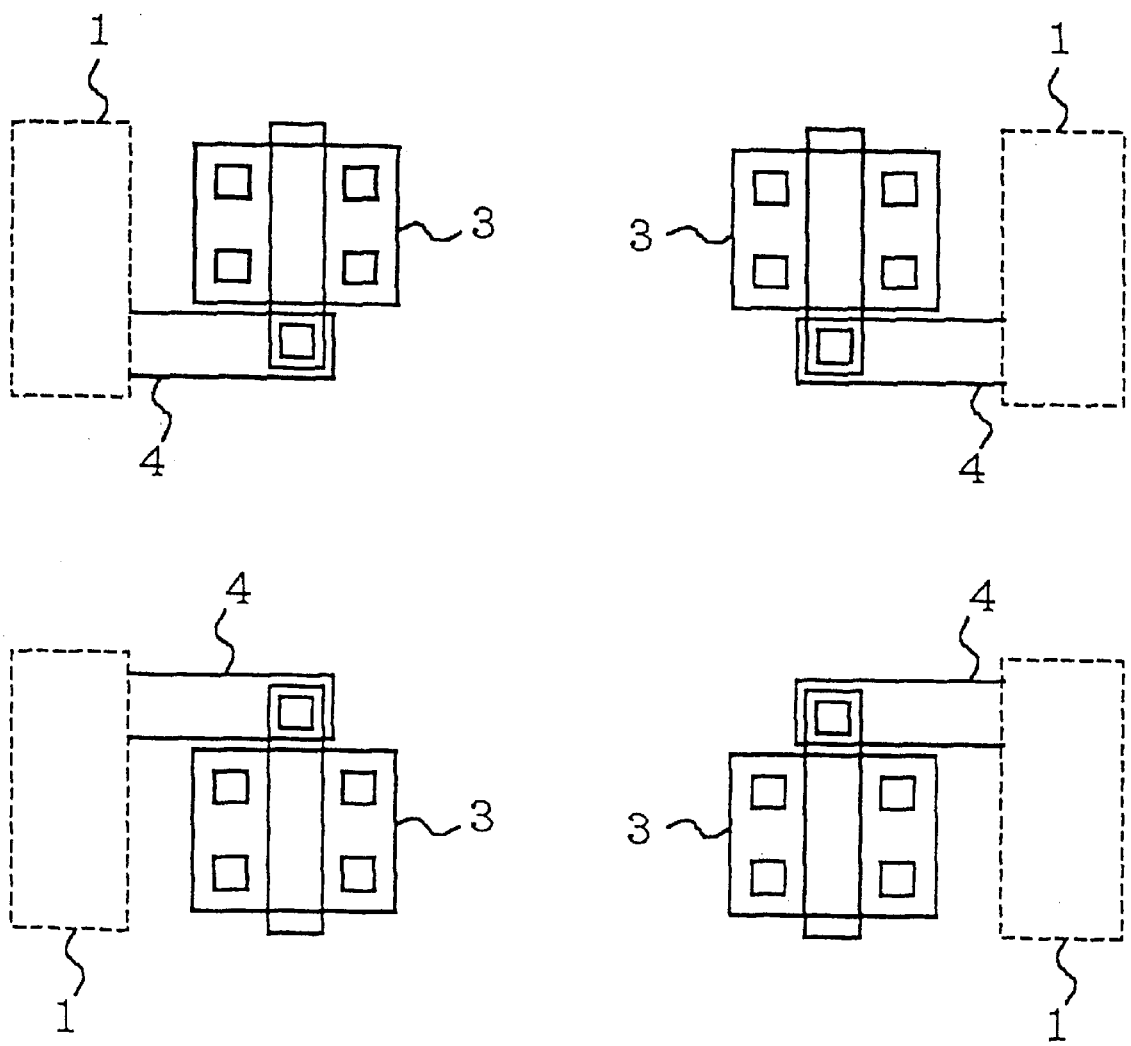
FIG. 7 is a diagram illustrative of a novel layout of the semiconductor integrated circuit having a plurality of pairs of the first type semiconductor device and the second type semiconductor device shown in FIG. 6 in this first embodiment in accordance with the present invention.

FIG. 7 is a diagram illustrative of a novel layout of the semiconductor integrated circuit having a plurality of pairs of the first type semiconductor device and the second type semiconductor device shown in FIG. 6 in this first embodiment in accordance with the present invention.

Figure 3:
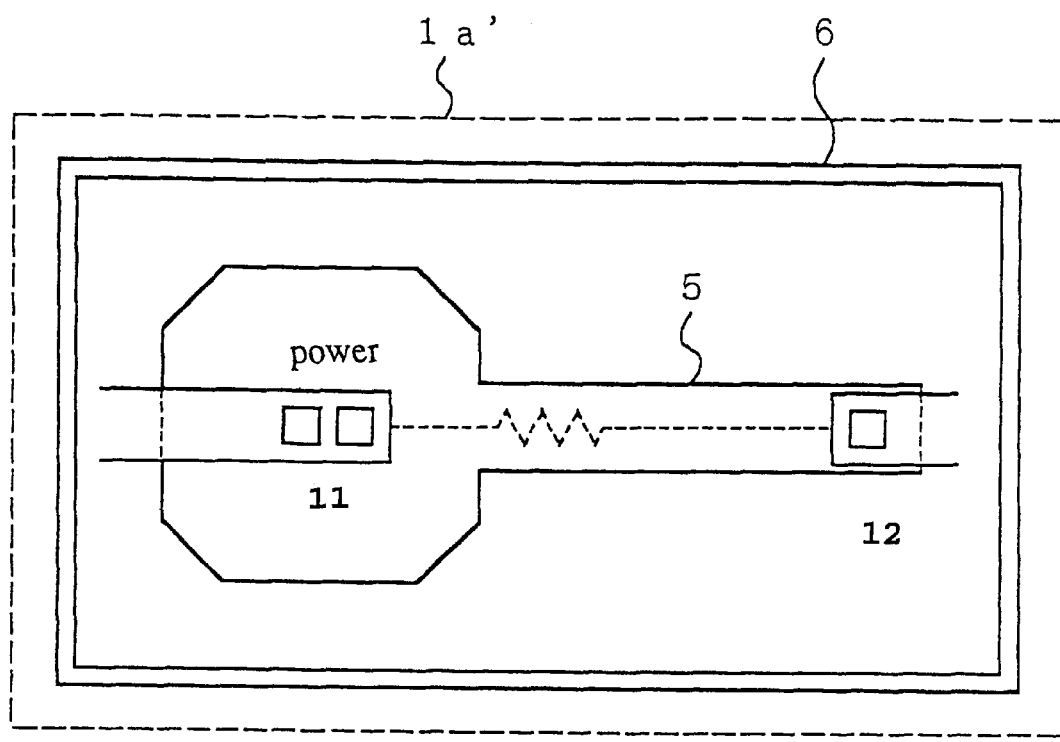
FIG. 3 is a diagram illustrative of another conventional layout of the resistances in a part of the semiconductor integrated circuit in FIG. 1.
Figure 4:
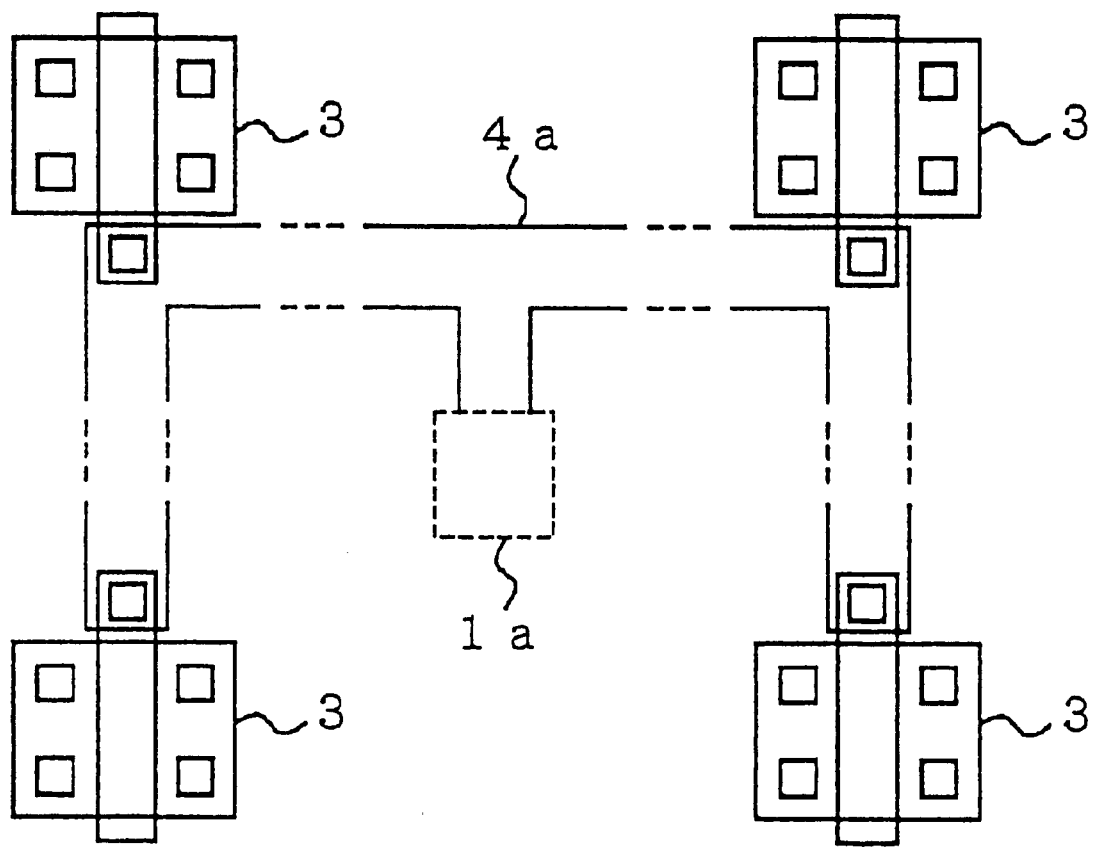
FIG. 4 is a diagram illustrative of the conventional layout of the semiconductor integrated circuit using the transistor region of FIG. 2 or the resistance region of FIG. 3.

There are provided plural pairs of the first type MOS field effect transistor 2 designed in the electrostatic discharge standard and the second type MOS field effect transistor 3 designed in the normal standard and connected through the interconnection 4 to the first type MOS field effect transistor 2. This novel layout allows shortening the length of the individual interconnections 4, whereby the total area of the integrated circuit can be reduced. Further, none of such the conventional diffusion resistance as shown in FIG. 3 is needed.

Whereas in this embodiment, the first type MOS field effect transistor 2 is the transistor for supplying the gate voltage to the second type MOS field effect transistor 3 designed in the normal standard, it is also possible that the first type MOS field effect transistor 2 is the transistor for supplying the source voltage to the second type MOS field effect transistor 3 designed in the normal standard.

Second Embodiment

Figure 8:
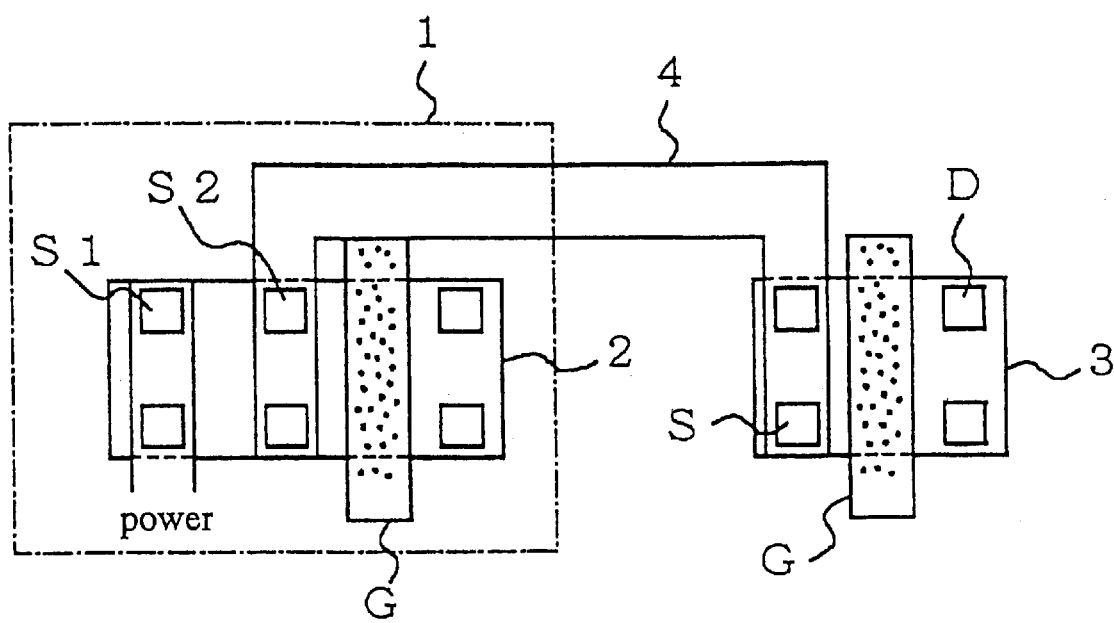
FIG. 8 is a diagram illustrative of a novel layout of a semiconductor integrated circuit having a first type MOS field effect transistor designed in an electrostatic discharge standard and a second type MOS field effect transistor designed in a normal discharge standard connected through an interconnection to said first type MOS field effect transistor in a second embodiment according to the present invention

A second embodiment according to the present invention will be described in detail with reference to the drawings. FIG. 8 is a diagram illustrative of a novel layout of a semiconductor integrated circuit having a first type MOS field effect transistor designed in an electrostatic discharge standard and a second type MOS field effect transistor designed in a normal discharge standard connected through an interconnection to said first type MOS field effect transistor in a second embodiment according to the present invention.

A first type MOS field effect transistor 2 is designed in an electrostatic discharge standard and is provided in a power supply transistor region 1. The first type MOS field effect transistor 2 has source and drain diffusion regions and a gate electrode "G". Two drain contacts "D" are provided in the drain region and also aligned along a channel width direction of the first type MOS field effect transistor 2. A first set of first type source contacts S1 and a second set of second type source contacts S2 are provided in the source region. The first type source contacts S1 are positioned in a first sub-ordinate region of the source region, wherein the first sub-ordinate region is close to an opposite side to an adjacent side to a channel region over which the gate electrode "G" is formed. The first type source contacts S1 are aligned along the opposite side. The first type source contacts S1 are electrically connected to a power supply line which supplies a power voltage which is higher than a ground level. The second type source contacts S2 are positioned in a second sub-ordinate region of the source region, wherein the second sub-ordinate region is closer to the adjacent side to the channel region. The second sub-ordinate region is separated from the first sub-ordinate region by an intermediate sub-ordinate region which acts to provide a diffusion resistance 5 between the first type and second type source contacts S1 and S2. The second type source contacts S2 are aligned along the adjacent side. The second type source contacts S2 are electrically connected through the diffusion resistance 5 provided by the intermediate sub-ordinate region to the first type source contacts S1, whereby the second type source contacts S2 receive a lower voltage level than the power voltage level of the first type source contacts S1 by a voltage drop due to the diffusion resistance 5.

A second type MOS field effect transistor 3 is designed in a normal standard and is provided in a region separated from the above power supply transistor region 1. The second type MOS field effect transistor 3 has source and drain diffusion regions and a gate electrode "G". Two drain contacts are provided in the drain region and also aligned along a channel width direction of the first type MOS field effect transistor 2. Two source contacts are provided in the source region and also aligned along the channel width direction.

An interconnection 4 extends between the second set of the second type source contacts "S2" and the source contacts "S" of the second type MOS field effect transistor 3, so that the lower voltage level dropped by the diffusion resistance 5 from the power voltage level is also applied through the interconnection 4 to the source contacts "S" of the second type MOS field effect transistor 3.

The above novel source contact layout provides a plurality of the first type source contacts and a plurality of second type source contacts so as to prevent concentration of charges and also prevents the contacts from being broken.

The above novel source contact layout providing a plurality of the first type source contacts and a plurality of second type source contacts, however, effectively utilizes an increased area of the source region of the transistor designed in the electrostatic discharge standard which requires the enlargement of the source regions as described with reference to FIG. 5A, without any unnecessary increase in the total area of the integrated circuit.

Figure 9:
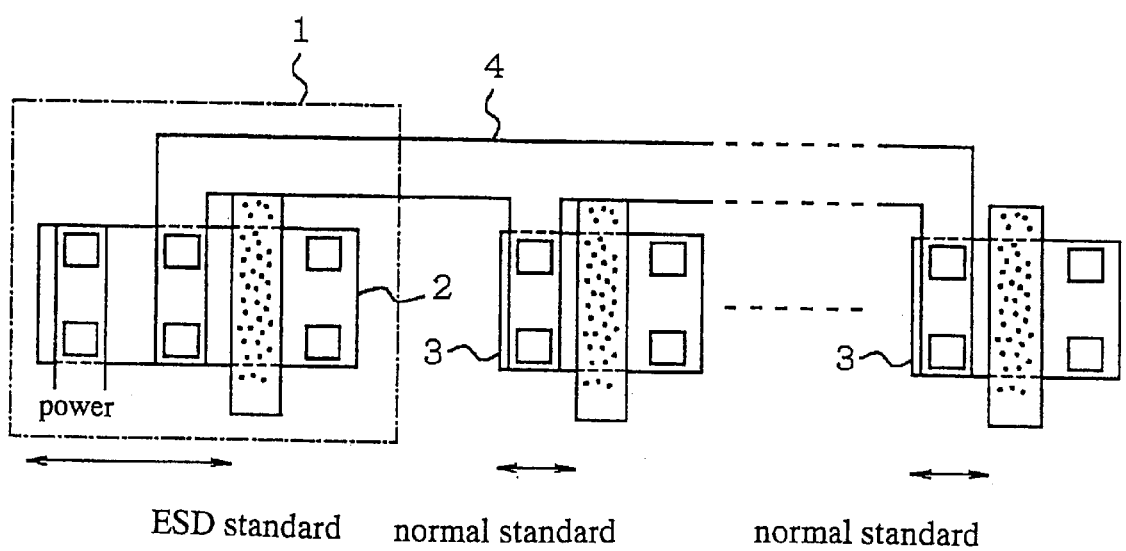
FIG. 9 is a diagram illustrative of a novel layout of the semiconductor integrated circuit having a plurality of pairs of the first type semiconductor device and the second type semiconductor device shown in FIG. 8 in this second embodiment in accordance with the present invention.

FIG. 9 is a diagram illustrative of a novel layout of the semiconductor integrated circuit having a plurality of pairs of the first type semiconductor device and the second type semiconductor device shown in FIG. 8 in this second embodiment in accordance with the present invention.

There are provided a single first type MOS field effect transistor 2 designed in the electrostatic discharge standard and a plurality of the second type MOS field effect transistors 3 designed in the normal standard and connected through the interconnection 4 commonly to the single first type MOS field effect transistor 2. This novel layout allows reducing the number of the first type MOS field effect transistor 2 designed in the electrostatic discharge standard, whereby the total area of the integrated circuit can be reduced.

Third Embodiment

Figure 10:
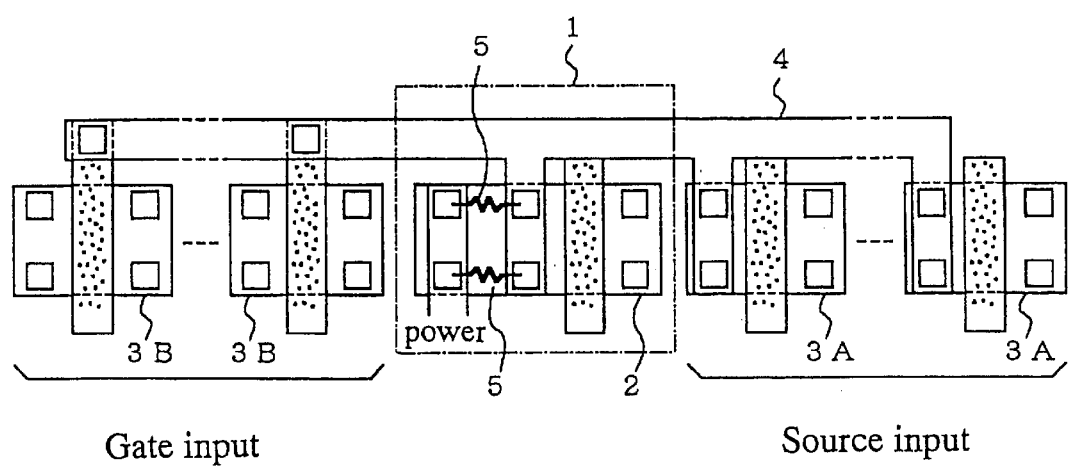
FIG. 10 is a diagram illustrative of a novel layout of a semiconductor integrated circuit having a first type MOS field effect transistor designed in an electrostatic discharge standard and first and second sets of second type MOS field effect transistors designed in a normal discharge standard connected through an interconnection to said first type MOS field effect transistor in a third embodiment according to the present invention.

A third embodiment according to the present invention will be described in detail with reference to the drawings. FIG. 10 is a diagram illustrative of a novel layout of a semiconductor integrated circuit having a first type MOS field effect transistor designed in an electrostatic discharge standard and first and second sets of second type MOS field effect transistors designed in a normal discharge standard connected through an interconnection to said first type MOS field effect transistor in a third embodiment according to the present invention.

A first type MOS field effect transistor 2 is designed in an electrostatic discharge standard and is provided in a power supply transistor region 1. The first type MOS field effect transistor 2 has source and drain diffusion regions and a gate electrode "G". Two drain contacts "D" are provided in the drain region and also aligned along a channel width direction of the first type MOS field effect transistor 2. A first set of first type source contacts S1 and a second set of second type source contacts S2 arc provided in the source region. The first type source contacts S1 are positioned in a first sub-ordinate region of the source region, wherein the first sub-ordinate region is close to an opposite side to an adjacent side to a channel region over which the gate electrode "G" is formed. The first type source contacts S1 are aligned along the opposite side. The first type source contacts S1 are electrically connected to a power supply line which supplies a power voltage which is higher than a ground level. The second type source contacts S2 are positioned in a second sub-ordinate region of the source region, wherein the second sub-ordinate region is closer to the adjacent side to the channel region. The second sub-ordinate region is separated from the first sub-ordinate region by an intermediate sub-ordinate region which acts to provide a diffusion resistance 5 between the first type and second type source contacts S1 and S2 The second type source contacts S2 are aligned along the adjacent side. The second type source contacts S2 are electrically connected through the diffusion resistance 5 provided by the intermediate sub-ordinate region to the first type source contacts S1, whereby the second type source contacts S2 receive a lower voltage level than the power voltage level of the first type source contacts S1 by a voltage drop due to the diffusion resistance 5.

A plurality of source input second type MOS field effect transistors 3A are designed in a normal standard and are provided in a region separated from the above power supply transistor region 1. Each of the source input second type MOS field effect transistor 3A has source and drain diffusion regions and a gate electrode "G". Two drain contacts are provided in the drain region and also aligned along a channel width direction of the first type MOS field effect transistor 2. Two source contacts are provided in the source region and also aligned along the channel width direction.

A plurality of gate input second type MOS field effect transistors 3B are designed in a normal standard and are provided in a region separated from the above power supply transistor region 1. Each of the gate input second type MOS field effect transistors 3B has source and drain diffusion regions and a gate electrode "G". Two drain contacts are provided in the drain region and also aligned along a channel width direction of the first type MOS field effect transistor 2. Two source contacts are provided in the source region and also aligned along the channel width direction.

An interconnection 4 extends among the second set of the second type source contacts "S2" of the first type MOS field effect transistor 2, the source contacts "S" of the source input second type MOS field effect transistor 3A, and the gate electrodes "G" of the gate input second type MOS field effect transistor 3B, so that the lower voltage level dropped by the diffusion resistance 5 from the power voltage level is also applied through the interconnection 4 to the source contacts "S" of the source input second type MOS field effect transistors 3B and also to the gate electrodes "G" of the gate input second type MOS field effect transistor 3B.

The above novel source contact layout provides a plurality of the first type source contacts and a plurality of second type source contacts so as to prevent concentration of charges and also prevents the contacts from being broken.

The above novel source contact layout providing a plurality of the first type source contacts and a plurality of second type source contacts, however, effectively utilizes an increased area of the source region of the transistor designed in the electrostatic discharge standard which requires the enlargement of the source regions as described with reference to FIG. 5A, without any unnecessary increase in the total area of the integrated circuit.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A layout of contacts over a diffusion region of a semiconductor device, said layout comprising:
   a first contact set of at least a plurality of first type contacts being positioned in a first sub-ordinate region and being electrically connected to a voltage supply line supplying said first contact set with a first voltage level; and
   a second contact set of at least a plurality of second type contacts being positioned in a second sub-ordinate region which is separated from said first sub-ordinate region by an intermediate sub-ordinate region which acts to provide a first resistance between said first contact set and said second contact set, so that said second contact set receives a second voltage level different from said first voltage level.

2. The layout as claimed in claim 1, wherein said intermediate sub-ordinate region comprises an intermediate part of said diffusion region, which acts to provide said first resistance.

3. The layout as claimed in claim 2, wherein said semiconductor device is a field effect transistor having a gate electrode and said diffusion region is a source region, and said second sub-ordinate region is positioned closer to said gate electrode than said first sub-ordinate region, and said intermediate sub-ordinate region is an intermediate part of said source region, which acts to provide said first resistance.

4. The layout as claimed in claim 3, wherein said first contact set comprises a plurality of said first type contacts aligned along an opposite side to an adjacent side to a channel region over which said gate electrode extends, and said second contact set comprises a plurality of said second type contacts aligned along said adjacent side.

5. A layout of at least a first type semiconductor device, at least a second type semiconductor device being smaller in occupied area than said first type semiconductor device, and at least an interconnection extending at least between said first type semiconductor device and said second type semiconductor device,
   wherein said first type semiconductor device has a layout as claimed in claim 1, and said interconnection is connected with said second contact set, so that said second voltage level is applied through said interconnection to said second type semiconductor device.

6. The layout as claimed in claim 5, wherein said intermediate sub-ordinate region comprises an intermediate part of said diffusion region, which acts to provide said first resistance.

7. The layout as claimed in claim 6, wherein said first type and second type semiconductor devices are field effect transistors having gate electrodes, and said diffusion region of said first type semiconductor device is a source region, and said second sub-ordinate region is positioned closer to said gate electrode than said first sub-ordinate region, and said intermediate sub-ordinate region is an intermediate part of said source region, which acts to provide said first resistance.

8. The layout as claimed in claim 7, wherein said first contact set comprises a plurality of said first type contacts aligned along an opposite side to an adjacent side to a channel region over which said gate electrode extends, and said second contact set comprises a plurality of said second type contacts aligned along said adjacent side.

9. The layout as claimed in claim 7, wherein said interconnection extends between said second contact set of said first type semiconductor device and said gate electrode of said second type semiconductor device, so that said second voltage level is applied through said interconnection to said gate of said second type semiconductor device.

10. The layout as claimed in claim 9, wherein plural pairs of said first type semiconductor device and said second type semiconductor device are separately integrated from each other.

11. The layout as claimed in claim 7, wherein said interconnection extends between said second contact set of said first type semiconductor device and at least a source contact of said second type semiconductor device, so that said second voltage level is applied through said interconnection to said source contact of said second type semiconductor device.

12. The layout as claimed in claim 11, wherein a plurality of said second type semiconductor devices are commonly connected through said interconnection to said second contact set of said first type semiconductor device.

13. The layout as claimed in claim 7, wherein said interconnection extends among said second contact set of said first type semiconductor device, said gate electrode of at least one of said second type semiconductor devices, and a source contact set of at least another of said second type semiconductor devices, so that said second voltage level is applied through said interconnection to both said gate electrode of said at least one of said second type semiconductor devices and also said source contact set of said at least another of said second type semiconductor devices.

14. The layout as claimed in claim 13, wherein said interconnection extends among said second contact set of said first type semiconductor device, said gate electrodes of a fist plurality of said second type semiconductor devices, and said source contact sets of a second plurality of said second type semiconductor devices, so that said second voltage level is applied through said interconnection to both said gate electrodes of said first plurality of said second type semiconductor devices and also said source contact set of said second plurality of said second type semiconductor devices.

15. A contact structure over a diffusion region of a semiconductor device, said contact structure comprising:
   a first contact set of at least a plurality of first type contacts being positioned in a first sub-ordinate region and being electrically connected to a voltage supply line supplying said first contact set with a first voltage level; and
   a second contact set of at least a plurality of second type contacts being positioned in a second sub-ordinate region which is separated from said first sub-ordinate region by an intermediate sub-ordinate region which acts to provide a first resistance between said first contact set and said second contact set, so that said second contact set receives a second voltage level different from said first voltage level.

16. The contact structure as claimed in claim 15, wherein said intermediate sub-ordinate region comprises an intermediate part of said diffusion region, which acts to provide said first resistance.

17. The contact structure as claimed in claim 16, wherein said semiconductor device is a field effect transistor having a gate electrode and said diffusion region is a source region, and said second sub-ordinate region is positioned closer to said gate electrode than said first sub-ordinate region, and said intermediate sub-ordinate region is an intermediate part of said source region, which acts to provide said first resistance.

18. The contact structure as claimed in claim 17, wherein said first contact set comprises a plurality of said first type contacts aligned along an opposite side to an adjacent side to a channel region over which said gate electrode extends, and said second contact set comprises a plurality of said second type contacts aligned along said adjacent side.

19. A semiconductor integrated circuit of at least a first type semiconductor device, at least a second type semiconductor device being smaller in occupied area than said first type semiconductor device, and at least an interconnection extending at least between said first type semiconductor device and said second type semiconductor device, wherein said first type semiconductor device has a contact structure as claimed in claim 15, and said interconnection is connected with said second contact set, so that said second voltage level is applied through said interconnection to said second type semiconductor device.

20. The semiconductor integrated circuit as claimed in claim 19, wherein said intermediate sub-ordinate region comprises an intermediate part of said diffusion region, which acts to provide said first resistance.

21. The semiconductor integrated circuit as claimed in claim 20, wherein said first type and second type semiconductor devices are field effect transistors having gate electrodes, and said diffusion region of said first type semiconductor device is a source region, and said second sub-ordinate region is positioned closer to said gate electrode than said first sub-ordinate region, and said intermediate sub-ordinate region is an intermediate part of said source region, which acts to provide said first resistance.

22. The semiconductor integrated circuit as claimed in claim 21, wherein said first contact set comprises a plurality of said first type contacts aligned along an opposite side to an adjacent side to a channel region over which said gate electrode extends, and said second contact set comprises a plurality of said second type contacts aligned along said adjacent side.

23. The semiconductor integrated circuit as claimed in claim 21, wherein said interconnection extends between said second contact set of said first type semiconductor device and said gate electrode of said second type semiconductor device, so that said second voltage level is applied through said interconnection to said gate of said second type semiconductor device.

24. The semiconductor integrated circuit as claimed in claim 23, wherein plural pairs of said first type semiconductor device and said second type semiconductor device are separately integrated from each other.

25. The semiconductor integrated circuit as claimed in claim 21, wherein said interconnection extends between said second contact set of said first type semiconductor device and at least a source contact of said second type semiconductor device, so that said second voltage level is applied through said interconnection to said source contact of said second type semiconductor device.

26. The semiconductor integrated circuit as claimed in claim 25, wherein a plurality of said second type semiconductor devices are commonly connected through said interconnection to said second contact set of said first type semiconductor device.

27. The semiconductor integrated circuit as claimed in claim 21, wherein said interconnection extends among said second contact set of said first type semiconductor device, said gate electrode of at least one of said second type semiconductor devices, and a source contact set of at least another of said second type semiconductor devices, so that said second voltage level is applied through said interconnection to both said gate electrode of said at least one of said second type semiconductor devices and also said source contact set of said at least another of said second type semiconductor devices.

28. The semiconductor integrated circuit as claimed in claim 27, wherein said interconnection extends among said second contact set of said first type semiconductor device, said gate electrodes of a first plurality of said second type semiconductor devices, and said source contact sets of a second plurality of said second type semiconductor devices, so that said second voltage level is applied through said interconnection to both said gate electrodes of said first plurality of said second type semiconductor devices and also said source contact set of said second plurality of said second type semiconductor devices.

* * * * *